(12) United States Patent
Shei et al.

(10) Patent No.: US 7,253,013 B2
(45) Date of Patent: Aug. 7, 2007

(54) METHOD FOR MANUFACTURING LIGHT-EMITTING DIODE

(75) Inventors: Shih-Chang Shei, Tainan County (TW); Yen-Wei Chen, Tainan County (TW); Wei-Shou Chen, Tainan County (TW); Chia-Sheng Chang, Tainan County (TW); Hsin-Ming Lo, Tainan County (TW); Chien-Fu Shen, Tainan County (TW)

(73) Assignee: South Epitaxy Corporation, Taiwan (CN)

( * ) Notice: Subject to any disclaimer, the term of this patent is extended or adjusted under 35 U.S.C. 154(b) by 268 days.

(21) Appl. No.: 10/960,616

(22) Filed: Oct. 6, 2004

(65) Prior Publication Data

US 2005/0208691 A1 Sep. 22, 2005

(30) Foreign Application Priority Data

Mar. 17, 2004 (TW) .............................. 93107175 A

(51) Int. Cl.
*H01L 21/00* (2006.01)
(52) U.S. Cl. ........................... 438/22; 438/46; 438/455
(58) Field of Classification Search .................... 48/22, 48/46, 455
See application file for complete search history.

(56) References Cited

U.S. PATENT DOCUMENTS

2003/0164503 A1* 9/2003 Chen ........................... 257/79

* cited by examiner

*Primary Examiner*—Long Pham
(74) *Attorney, Agent, or Firm*—Michael A. Glenn; Glenn Patent Group

(57) ABSTRACT

A method for manufacturing a light-emitting diode (LED) is described. The method comprises: providing a temporary substrate; forming an illuminant epitaxial structure on the temporary substrate; forming a first transparent conductive layer on the illuminant epitaxial structure; forming a metal substrate on the first transparent conductive layer; forming an adhesion layer on the metal substrate; providing a supporting substrate, wherein the supporting substrate is connected to the metal substrate by the adhesion layer; removing the temporary substrate, so as to expose a surface of the illuminant epitaxial structure; forming a second transparent conductive layer on the exposed surface of the illuminant epitaxial structure; and forming an electrode on a portion of the second transparent conductive layer.

20 Claims, 5 Drawing Sheets

METHOD FOR MANUFACTURING LIGHT-EMITTING DIODE

RELATED APPLICATIONS

The present application is based on, and claims priority from, Taiwan Application Serial Number 93107175, filed Mar. 17, 2004, the disclosure of which is hereby incorporated by reference herein in its entirety.

FIELD OF THE INVENTION

The present invention relates to a method for manufacturing a light-emitting diode (LED), and more particularly, to a method for manufacturing a light-emitting diode with a high ability for heat dissipation.

BACKGROUND OF THE INVENTION

Light-emitting diodes are semiconductor illumination devices formed by using semiconductor materials. The light-emitting diodes are one kind of minute solid-state light source that can transform electrical energy into light energy. The semiconductor have many advantages, including small volume, a low driving voltage, rapid response speed, resistance to shock, and long life, and also can meet the light, thin, and miniaturization needs of various apparatuses. Light-emitting diodes have thus have become very popular electric products in daily life.

In the fabrication of light-emitting diodes, III-nitride-based semiconductors, such as GaN, AlGaN, InGaN and AlInGaN, are common. Usually, epitaxial structures of most of the light-emitting devices made of the III-nitride-based semiconductors are grown on an electrically insulating sapphire substrate, which is different from other light-emitting devices utilizing conductive substrates. The sapphire substrate is an insulator, so an electrode can be directly formed on the sapphire substrate. Electrodes have to be formed to contact respectively a p-type semiconductor layer and an n-type semiconductor layer directly, so that the light-emitting devices of the aforementioned type can be completed.

FIG. 1 illustrates a cross-sectional view of a conventional light-emitting diode. In the fabrication of the light-emitting diode, a buffer layer 102 is firstly formed on a transparent substrate 100 by deposition. The substrate 100 is typically made of sapphire. An n-type semiconductor layer 104 is epitaxially formed on the buffer layer 102, in which the n-type semiconductor layer 104 is typically made of III-nitrides. Next, an active layer 106 is epitaxially formed on the n-type semiconductor layer 104, in which the active layer 106 is typically a multiple quantum well (MQW) structure. A p-type semiconductor layer 108 is epitaxially grown on the active layer 106, in which the p-type semiconductor layer 108 is typically made of III-nitrides. An illuminant epitaxial structure is composed of the n-type semiconductor layer 104, the active layer 106 and the p-type semiconductor layer 108.

The substrate 100 is made of sapphire, an insulator, so contact electrodes of the light-emitting diode have to be formed to contact respectively the p-type semiconductor layer 108 and the n-type semiconductor layer 104 directly, and cannot be directly formed on the substrate 100 made of sapphire. Accordingly, after the illuminant epitaxial structure is formed, a definition step is performed by photolithography and etching to remove a portion of the active layer 106, a portion of the p-type semiconductor layer 108 and a portion of the n-type semiconductor layer 104, so as to expose a portion of the n-type semiconductor layer 104. Then, an electrode 110 and an electrode 112 are respectively formed on the p-type semiconductor layer 108 and the exposed portion of the n-type semiconductor layer 104 is formed directly by thermal evaporation, E-beam evaporation or ion-sputtering, so that the fabrication of the light-emitting diode is completed.

SUMMARY OF THE INVENTION

One objective of the present invention is to provide a method for manufacturing a light-emitting diode, in which a temporary substrate for support is provided on a metal substrate, to support an illuminant epitaxial structure in the subsequent processes. Therefore, it benefits the proceeding of the subsequent processes, thereby effectively enhancing the process yield.

Another objective of the present invention is to provide a method for manufacturing a light-emitting diode having a thick metal substrate, so that the light-emitting diode has an excellent capability for heat dissipation.

According to the aforementioned objectives, the present invention provides a method for manufacturing a light-emitting diode comprising: providing a temporary substrate; forming an illuminant epitaxial structure on the temporary substrate; forming a first transparent conductive layer on the illuminant epitaxial structure; forming a reflective layer on the first transparent conductive layer; forming a metal substrate on the reflective layer; forming an adhesion layer on the metal substrate; providing a supporting substrate, wherein the supporting substrate is connected to the metal substrate by the adhesion layer; removing the temporary substrate, so as to expose a surface of the illuminant epitaxial structure; forming a second transparent conductive layer on the exposed surface of the illuminant epitaxial structure; and forming an electrode on a portion of the second transparent conductive layer.

According to a preferred embodiment of the present invention, the supporting substrate and the adhesion layer are made of conductors, so that the supporting substrate and the adhesion layer are not necessary to be removed. Therefore, the structural strength of the light-emitting diode device can be increased, and the process can be simplified.

According to the aforementioned description, a thick metal substrate is provided when a light-emitting diode device is fabricated in the present invention, so that the light-emitting diode device has an excellent capability for heat dissipation. In addition, in the fabrication of the light-emitting diode device, a temporary substrate used for support is provided and located on the metal substrate, to provide a structural support in the subsequent processes and to benefit the subsequent processes, thus achieving the objective of enhancing the process yield.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The present invention discloses a method for manufacturing a light-emitting diode. The method provides a temporary substrate for supporting, so an illuminant epitaxial structure can be supported structurally in the sequent processes, to achieve the objective of increasing the process yield. In order to make the illustration of the present invention more explicit and complete, the following description is stated with reference to FIGS. 2 to 8.

Figure 1:
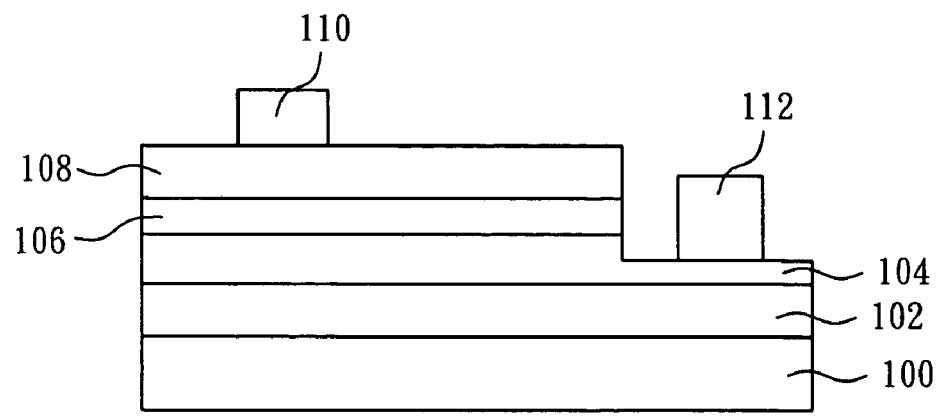
FIG. 1 illustrates a cross-sectional view of a conventional light-emitting diode.
Figure 2:
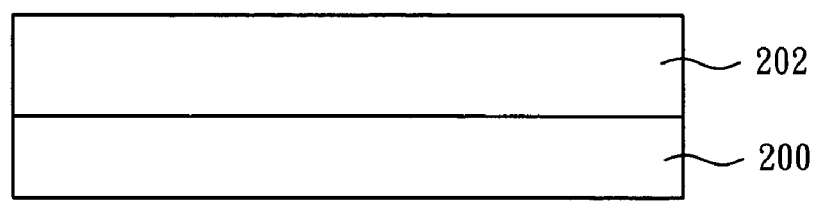
FIGS. 2 to 8 are schematic flow diagrams showing the process for manufacturing a light-emitting diode in accordance with a preferred embodiment of the present invention.

FIGS. 2 to 8 are schematic flow diagrams showing the process for manufacturing a light-emitting diode in accordance with a preferred embodiment of the present invention. A temporary substrate 200 is firstly provided, in which a material of the temporary substrate 200 is selected from the materials that can be lattice matched with an epitaxial layer grown thereon sequentially, and a material of the temporary substrate 200 can be sapphire, SiC or GaAs, for example. An illuminant epitaxial structure 202 is grown on the temporary substrate 200 by, for example, epitaxy, so as to form a structure such as illustrated in FIG. 2. The illuminant epitaxial structure 202 comprises an n-type semiconductor layer 202a, an active layer 202b and a p-type semiconductor layer 202c, in which a material of the n-type semiconductor layer 202a can be n-type AlGaInP or n-type GaN, the p-type semiconductor layer 202c can be p-type AlGaInP or p-type GaN, and the active layer 202b can be a multiple quantum well structure, for example.

Figure 3:
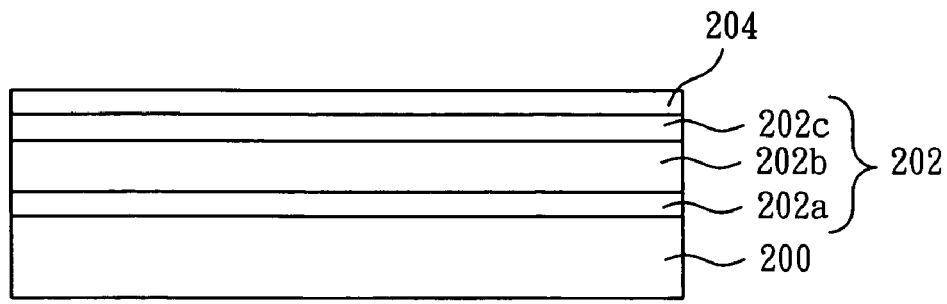
Figure 4:
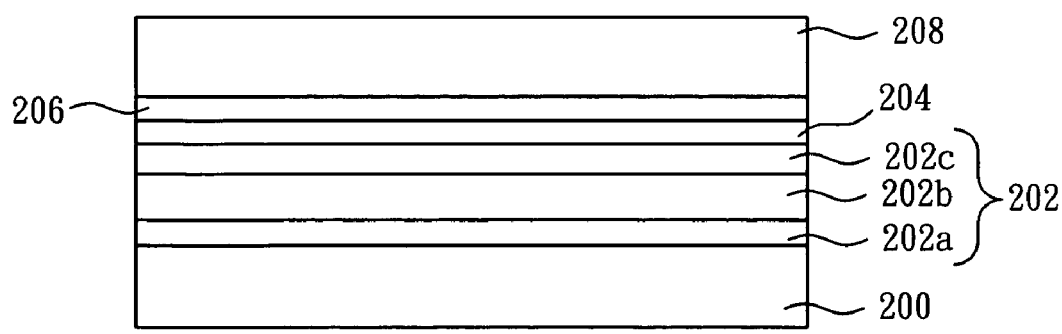

After the illuminant epitaxial structure 202 is formed, a transparent conductive layer 204 is formed to cover the illuminant epitaxial structure 202, so as to form a structure such as illustrated in FIG. 3, in which a material of the transparent conductive layer 204 can be, for example, indium tin oxide (ITO), ZnO, cadmium tin oxide (CTO), TiWN, $In_2O_3$, $SnO_2$, MgO, $ZnGa_2O_4$, $SnO_2$/Sb, $Ga_2O_3$/Sn, $AgInO_2$/Sn, $In_2O_3$/Zn, $CuAlO_2$, LaCuOS, NiO, $CuGaO_2$, or $SrCu_2O_2$. The transparent conductive layer 204 is also called a transparent electrode layer, and the transparent conductive layer 204 not only can have a good ohmic contact with the illuminant epitaxial structure 202, but also have a current-spreading function.

Next, a thin reflective layer 206 is formed by evaporation, sputtering, electroplating or electroless electroplating, and a material of the reflective layer 206 can be a reflective material, such as Au, Ag, Al, In, Sn, Pt, Ti, Zn, Pb, AuBe, Ni, PbSn or AuZn. After the reflective layer 206 is formed, a metal substrate 208 of large thickness is formed to form the structure illustrated in FIG. 4 by evaporation, sputtering, electroplating or electroless electroplating. The thickness of the metal substrate 208 is preferably between 30 μm and 150 μm, and a material of the metal substrate 208 can be, for example, Al, Pt, Pd, Zn, Ni, Ti, In, Cr, Cu, Sn, Ag or an alloy thereof.

One feature of the present invention is that the metal substrate 208 of large thickness is provided, and the metal substrate 208 has excellent heat conductivity, so the heat dissipation capability of the light-emitting diode device can be greatly enhanced to achieve the objective of increasing the performance of the light-emitting diode device.

It is worthy of note that if the material of the metal substrate 208 has an excellent reflective capability, the reflective layer 206 can be eliminated.

Figure 5:
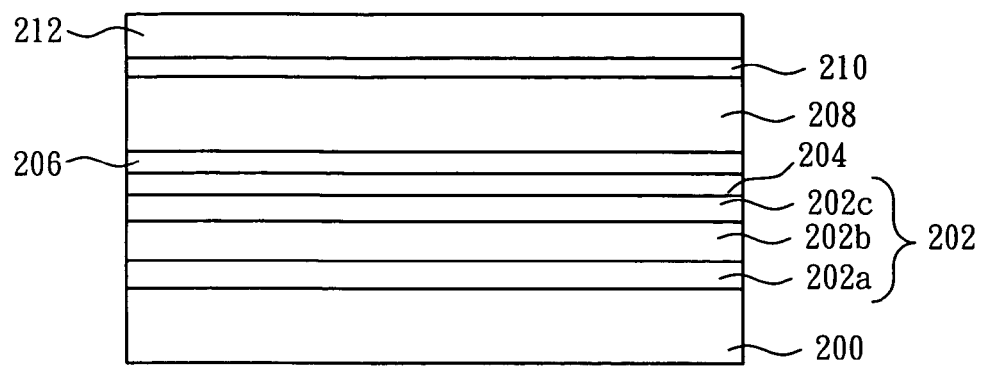

Then, an adhesion layer 210 is formed on the metal substrate 208, and a material of the adhesion layer 210 is preferably selected from the materials that are convenient for adhesion and removal. A material of the adhesion layer 210 can be a non-conductive material, such as wax or epoxy resin, or can be a conductive material, such as Au, AuBe, AuZn, Pt, Pd, Cu, Ni, In, Al, Ag, Cr, Ti, AuSn, InSn, PbSn, SnAgCu, or SnCu. Next, a supporting substrate 212 is provided, and the supporting substrate 212 is connected to the metal substrate 208 by the adhesion layer 210 and a wafer bonding method, so as to formed a structure such as illustrated in FIG. 5. A material of the supporting substrate 212 can be selected from conductive materials or nonconductive materials, and the material of the supporting substrate 212 can be selected from materials of higher structural strength. The material of the supporting substrate 212 can be, for example, silicon, or a nonconductive material, such as AlN, BN, $Al_2O_3$, MgO, BeO, $TiO_2$ or $SiO_2$.

Another feature of the present invention is that the structural strength of the metal substrate 208 is lesser, and the structural strength of the supporting substrate 212 is greater, so the illuminant epitaxial structure 202 can be supported by the supporting substrate 210 in the subsequent processes, thereby reducing damage to the illuminant epitaxial structure 202. Therefore, the process yield can be greatly increased to solve the problem of low yield in the conventional process.

Figure 6:
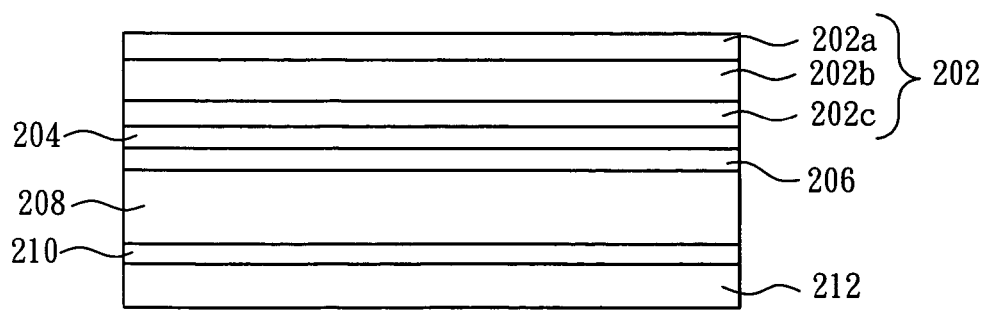

After the supporting substrate 212 is adhered to the metal substrate 208, the temporary substrate 200 and the structural layers formed thereon are reversed. Next, the temporary substrate 200 is removed by, for example, polishing, chemical etching or laser stripping, so as to expose a surface of the illuminant epitaxial structure 202, as illustrated in FIG. 6. The polishing can be, for example, chemical mechanical polishing (CMP), and chemical etching can be dry etching or wet etching. After the temporary substrate 200 is removed, the illuminant efficiency of the light-emitting diode can be increased.

After the temporary substrate 200 is removed, a transparent conductive layer 214 is formed to cover the exposed surface of the illuminant epitaxial structure 202, in which a material of the transparent conductive layer 214 can be, for example, indium tin oxide, ZnO, cadmium tin oxide, TiWN, $In_2O_3$, $SnO_2$, MgO, $ZnGa_2O_4$, $SnO_2$/Sb, $Ga_2O_3$/Sn, $AgInO_2$/Sn, $In_2O_3$/Zn, $CuAlO_2$, LaCuOS, NiO, $CuGaO_2$, or $SrCu_2O_2$. The transparent conductive layer 214 is also called a transparent electrode layer, and the transparent conductive layer 214 not only has a good ohmic contact with the illuminant epitaxial structure 202, but also has a current-spreading function, to make the current more uniform and increase the illuminant efficiency of the light-emitting diode. Then, an electrode 216 is formed on a portion of the transparent conductive layer 214 by, for example, evaporation or electroplating, so as to form a structure such as the one illustrated in FIG. 7a. A material of the electrode 216 is preferably selected from materials having reflective capability, to reduce light emitted from the illuminant epitaxial structure 202 being absorbed by the electrode 216. The electrode 216 is preferably a Cu layer, and more preferably a composite structure composed of a Cu layer and an indium (In) layer.

Figure 7A:
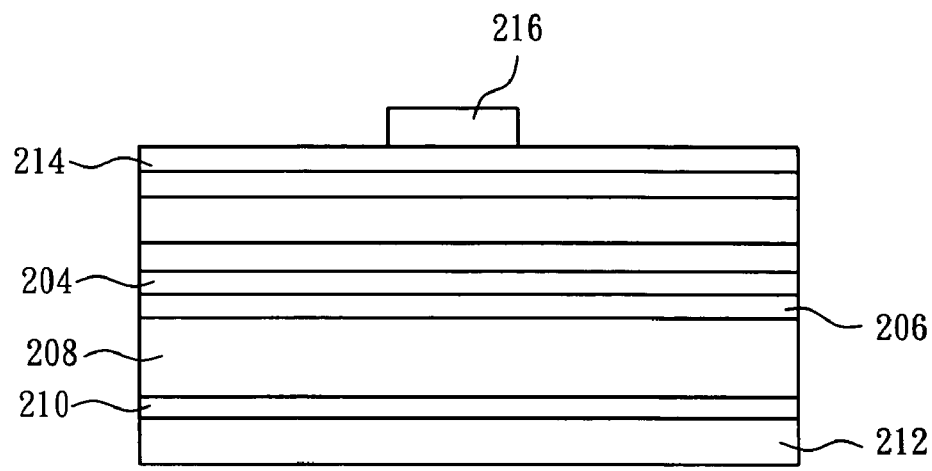
Figure 7B:
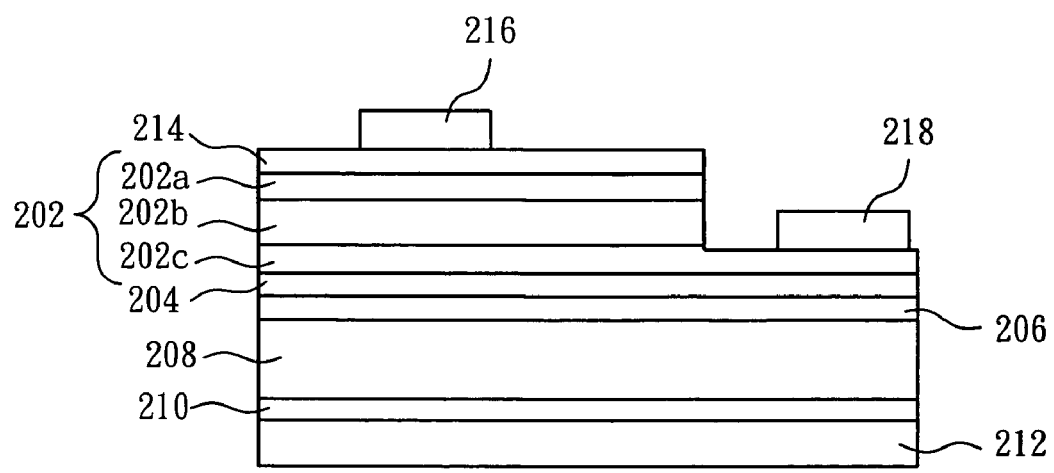

In another preferred embodiment of the present invention, before the transparent conductive layer 214 is formed, a portion of the n-type semiconductor layer 202a and a portion of the active layer 202b can be removed firstly by a photolithography process and an etching process until a portion of the p-type semiconductor layer 202c is exposed. Then, the transparent conductive layer 214 is formed on the n-type semiconductor layer 202a of the illuminant epitaxial structure 202. Subsequently, the electrode 216 and an electrode 218 are formed on the n-type semiconductor layer 202a and a portion of the exposed portion of the p-type semiconductor layer 202c, respectively, as illustrated in FIG. 7b.

Figure 8:
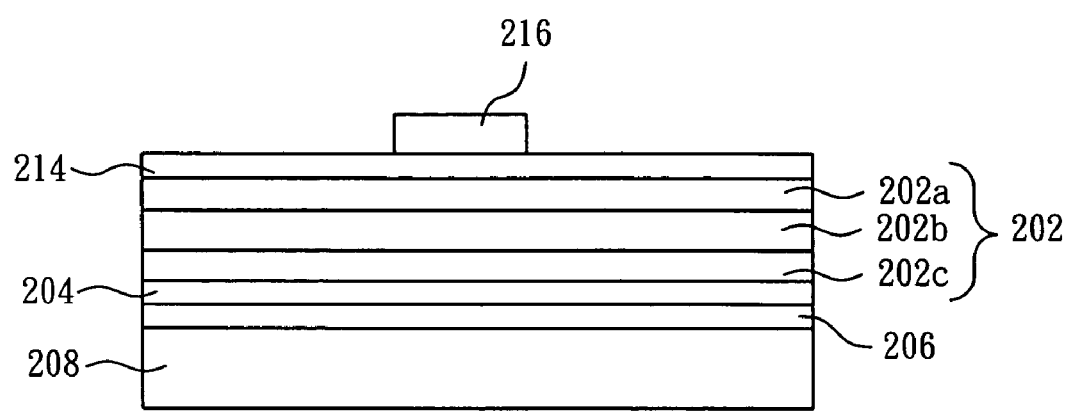

In the present invention, while the adhesion layer 210 and the supporting substrate 212 are made of conductive materials, the adhesion layer 210 and the supporting substrate 212 need not be removed, and thus the fabrication of the light-emitting diode structure according to an embodiment of the present invention is completed. Then, light-emitting diode chips are formed after dicing, and the fabrication of light-emitting diode devices are completed. However, the adhesion layer 210 and the supporting substrate 212 also can be removed when the adhesion layer 210 and the supporting substrate 212 are made of conductive materials. When at least one of the adhesion layer 210 and the supporting substrate 212 is made of conductive materials, the adhesion layer 210 and the supporting substrate 212 have to be removed. After the adhesion layer 210 and the supporting substrate 212 are removed by, for example, a stripping method, a chemical etching method, a polishing method or a laser stripping method, the metal substrate 208 is exposed, to complete the fabrication of the light-emitting diode structure according to another embodiment of the present invention, as illustrated in FIG. 8. Then, light-emitting diode chips are formed after dicing, and the fabrication of light-emitting diode devices is completed.

It is worthy of note that the electrode and the electrode 218 can also be formed by, for example, evaporation or electroplating, after the supporting substrate 212 is removed.

According to the aforementioned description, one advantage of the present invention is that the light-emitting diode of the present invention has a very thick metal substrate, so that the heat-dissipating capability of the light-emitting diode can be greatly enhanced.

According to the aforementioned description, one advantage of the present invention is that a supporting substrate having high structural strength is provided on the metal substrate in the fabrication of the light-emitting diode of the present invention, so that the illuminant epitaxial structure is strongly supported in the subsequent processes, to the benefit of the subsequent processes. Therefore, the damage of the illuminant epitaxial structure is reduced, to enhance effectively the process yield and achieve the objective of increasing the quality of the light-emitting diode.

As is understood by a person skilled in the art, the foregoing preferred embodiments of the present invention are illustrative of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A method for manufacturing a light-emitting diode, comprising:
   providing a temporary substrate;
   forming an illuminant epitaxial structure on the temporary substrate, wherein the illuminant epitaxial structure includes a first surface and a second surface on opposite sides of the illuminant epitaxial structure, and the temporary substrate contacts with the first surface of the illuminant epitaxial structure;
   forming a first transparent conductive layer on the second surface of the illuminant epitaxial structure;
   forming a metal substrate on the first transparent conductive layer;
   forming an adhesion layer on the metal substrate;
   providing a supporting substrate, wherein the supporting substrate is connected to the metal substrate by the adhesion layer;
   removing the temporary substrate, so as to expose the first surface of the illuminant epitaxial structure;
   forming a second transparent conductive layer on the first surface of the illuminant epitaxial structure, wherein the second transparent conductive layer is opposite to the first transparent conductive layer with regard to the illuminant epitaxial structure; and
   forming an electrode on a portion of the second transparent conductive layer.

2. The method for manufacturing the light-emitting diode according to claim 1, wherein a material of the temporary substrate is selected from the group consisting of sapphire, SiC and GaAs.

3. The method for manufacturing the light-emitting diode according to claim 1, between the step of forming the first transparent conductive layer and the step of forming the metal substrate, further comprising forming a reflective layer on the first transparent conductive layer to make the reflective layer between the first transparent conductive layer and the metal substrate.

4. The method for manufacturing the light-emitting diode according to claim 3, wherein a material of the reflective layer is selected from the group consisting of Au, Ag, Al, In, Sn, Pt, Ti, Zn, Pb, AuBe, Ni, PbSn and AuZn.

5. The method for manufacturing the light-emitting diode according to claim 1, further comprising removing the supporting substrate and the adhesion layer after the step of forming the electrode.

6. The method for manufacturing the light-emitting diode according to claim 1, further comprising removing the supporting substrate and the adhesion layer before the step of forming the electrode.

7. The method for manufacturing the light-emitting diode according to claim 1, wherein the supporting substrate and the adhesion layer are made of nonconductors, and the method for manufacturing the light-emitting diode further comprises removing the supporting substrate and the adhesion layer after the step of forming the electrode.

8. The method for manufacturing the light-emitting diode according to claim 7, wherein a material of the supporting substrate is AlN.

9. The method for manufacturing the light-emitting diode according to claim 7, wherein a material of the adhesion layer is selected from the group consisting of wax and epoxy resin.

10. The method for manufacturing the light-emitting diode according to claim 1, wherein a material of the supporting substrate is silicon.

11. The method for manufacturing the light-emitting diode according to claim 1, wherein the supporting substrate and the adhesion layer are made of conductors.

12. The method for manufacturing the light-emitting diode according to claim 11, wherein a material of the adhesion layer is selected from the group consisting of Au, AuBe, AuZn, Pt, Pd, Cu, Ni, In, Al, Ag, Cr, Ti, AuSn, InSn, PbSn, SnAgCu and SnCu.

13. The method for manufacturing the light-emitting diode according to claim 1, wherein the iluminant epitaxial structure comprises an n-type semiconductor layer, an active layer and a p-type semiconductor layer stacked in sequence.

14. The method for manufacturing the light-emitting diode according to claim 1, wherein a material of the first transparent conductive layer is selected from the group consisting of indium tin oxide (ITO), ZnO, cadmium tin oxide (CTO)), TiWN, $In_2O_3$, $SnO_2$, MgO, $ZnGa_2O_4$, $SnO_2$/Sb, $Ga_2O_3$/Sn, $AgInO_2$/Sn, $In_2O_3$/Zn, $CUAlO_2$, LaCuOS, NiO, $CuGaO_2$, and $SrCu_2O_2$.

15. The method for manufacturing the light-emitting diode according to claim 1, wherein a material of the metal substrate is selected from the group consisting of Al, Pt, Pd, Zn, Ni, Ti, Cr, Cu, Sn, Ag, In and the alloy thereof.

16. The method for manufacturing the light-emitting diode according to claim 1, wherein a thickness of the metal substrate is between about 30 μm and 150 μm.

17. The method for manufacturing the light-emitting diode according to claim 1, wherein a method used in the step of forming the metal substrate is selected from the group consisting of an evaporation method, a sputtering method, an electroplating method and an electroless electroplating method.

18. The method for manufacturing the light-emitting diode according to claim 1, wherein a method used in the step of removing the temporary substrate is selected from the group consisting of a polishing method, a chemical etching method and a laser stripping method.

19. The method for manufacturing the light-emitting diode according to claim 1, wherein a material of the second transparent conductive layer is selected from the group consisting of indium tin oxide, ZnO, cadmium tin oxide, TiWN, $In_2O_3$, $SnO_2$, MgO, $ZnGa_2O_4$, $SnO_2$/Sb, $Ga_2O_3$/Sn, $AgInO_2$/Sn, $In_2O_3$/Zn, $CUAlO_2$, LaCuOS, NiO, $CuGaO_2$, and $SrCu_2O_2$.

20. The method for manufacturing the light-emitting diode according to claim 1, wherein the supporting substrate and the adhesion layer are made of nonconductors, and the method for manufacturing the light-emitting diode further comprises removing the supporting substrate and the adhesion layer before the step of forming the electrode.

* * * * *